United States Patent
Cox et al.

(10) Patent No.: US 10,834,852 B2
(45) Date of Patent: Nov. 10, 2020

(54) COOLING METHODS FOR ELECTRONIC COMPONENTS

(71) Applicant: International Business Machines Corporation, Armonk, NY (US)

(72) Inventors: Aaron R. Cox, Sherman, CT (US); William J. Grady, IV, Austin, TX (US); Jason A. Matteson, Raleigh, NC (US); Jason E. Minyard, Phoenix, AZ (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/386,405

(22) Filed: Apr. 17, 2019

(65) Prior Publication Data

US 2019/0246520 A1     Aug. 8, 2019

Related U.S. Application Data

(60) Continuation of application No. 15/253,925, filed on Sep. 1, 2016, now Pat. No. 10,334,757, which is a
(Continued)

(51) Int. Cl.
*H05K 3/30*      (2006.01)
*H05K 7/20*      (2006.01)
(Continued)

(52) U.S. Cl.
CPC ......... *H05K 7/20336* (2013.01); *F28D 15/02* (2013.01); *H01L 23/367* (2013.01);
(Continued)

(58) Field of Classification Search
CPC ............ H01L 23/367; H01L 23/46; H01L 2924/0002; H01L 2023/4056; H01L 23/40;
(Continued)

(56) References Cited

U.S. PATENT DOCUMENTS 5,812,372 A * 9/1998 Galyon ............ H01L 23/473
                                                    165/80.4
6,665,184 B2    12/2003   Akselband
(Continued)

FOREIGN PATENT DOCUMENTS

WO      2011109501 A2    9/2011

OTHER PUBLICATIONS

Crippen et al., "BladeCenter Packaging, Power, and Cooling", IBM Journal of Research and Development, Nov. 2005, vol. 49, No. 6, pp. 887-904, ©2005 IBM.
(Continued)

*Primary Examiner* — Donghai D Nguyen
(74) *Attorney, Agent, or Firm* — Nicholas D. Bowman

(57) ABSTRACT

A method and apparatus for conveying heat away from an electronic component. The apparatus may include, a conformable thermal interface sleeve adapted to embrace the electronic component. The apparatus may further include, a heat conducting wedge adapted to contact the conformable thermal interface sleeve and a thermal channel adapted to contact the heat conducting wedge. The apparatus may also include a manifold adapted to contact the thermal channel.

16 Claims, 9 Drawing Sheets

Related U.S. Application Data continuation of application No. 14/547,831, filed on Nov. 19, 2014, now Pat. No. 9,513,064, which is a division of application No. 13/677,671, filed on Nov. 15, 2012, now Pat. No. 9,068,784.

(51) Int. Cl.

| | | |
|---|---|---|
| *F28D 15/02* | (2006.01) | |
| *H01L 23/367* | (2006.01) | |
| *H01L 23/46* | (2006.01) | |
| *H01L 23/40* | (2006.01) | |

(52) U.S. Cl.
CPC ........... *H01L 23/46* (2013.01); *H05K 7/2039* (2013.01); *H05K 7/20309* (2013.01); *H05K 7/20318* (2013.01); *H01L 23/40* (2013.01); *H01L 2023/4056* (2013.01); *H01L 2924/0002* (2013.01); *Y10T 29/4935* (2015.01)

(58) Field of Classification Search
CPC .. F28D 15/02; H05K 7/2039; H05K 7/20318; H05K 7/20336; H05K 7/20309; Y10T 29/4935
USPC .......................................................... 29/832
See application file for complete search history.

(56) References Cited

U.S. PATENT DOCUMENTS

| | | |
|---|---|---|
| 6,862,185 B2 | 3/2005 | Morris |
| 7,023,701 B2 | 4/2006 | Stocken et al. |
| 7,522,421 B2 | 4/2009 | Roper et al. |
| 7,715,197 B2 | 5/2010 | Tian et al. |
| 7,826,217 B2 | 11/2010 | Kondo et al. |
| 7,933,125 B2 | 4/2011 | Wei et al. |
| 7,957,132 B2 | 6/2011 | Fried |
| 7,969,736 B1 | 6/2011 | Iyengar et al. |
| 8,027,162 B2 | 9/2011 | Campbell et al. |
| 8,315,055 B2 | 11/2012 | Joshi et al. |
| 3,488,325 A1 | 7/2013 | Yu |
| 8,570,744 B2 | 10/2013 | Rau et al. |
| 8,587,943 B2 | 11/2013 | Barina et al. |
| 8,587,946 B2 | 11/2013 | Lee et al. |
| 8,638,559 B2 | 1/2014 | Barina et al. |
| 9,068,784 B2 | 6/2015 | Cox et al. |
| 9,089,076 B2 | 7/2015 | Cox et al. |
| 9,245,820 B2 | 1/2016 | Goldrian et al. |
| 9,513,064 B2 | 12/2016 | Cox et al. |
| 2003/0015314 A1 | 1/2003 | Akselband |
| 2003/0151892 A1 | 8/2003 | Kondo et al. |
| 2004/0250989 A1 | 12/2004 | Im et al. |
| 2005/0168939 A1 | 8/2005 | Iijima et al. |
| 2007/0074850 A1 | 4/2007 | Peschl |
| 2007/0201208 A1 | 8/2007 | Goodwin et al. |
| 2007/0212919 A1 | 9/2007 | Clayton et al. |
| 2009/0000773 A1 | 1/2009 | Levy |
| 2009/0002951 A1 | 1/2009 | Legen et al. |
| 2009/0213541 A1 | 8/2009 | Butterbaugh et al. |
| 2009/0277616 A1 | 11/2009 | Cipolla et al. |
| 2009/0309214 A1 | 12/2009 | Szewerenko et al. |
| 2010/0091447 A1 | 4/2010 | Jaggers et al. |
| 2010/0243203 A1 | 9/2010 | Liu et al. |
| 2011/0170264 A1 | 7/2011 | Lee et al. |
| 2011/0310565 A1 | 12/2011 | He |
| 2012/0020022 A1 | 1/2012 | Peterson et al. |
| 2012/0113586 A1 | 5/2012 | Rau et al. |
| 2014/0133093 A1 | 5/2014 | Cox et al. |
| 2015/0075000 A1 | 3/2015 | Cox et al. |
| 2016/0374231 A1 | 12/2016 | Cox et al. |

OTHER PUBLICATIONS

Iyengar et al., "Server Liquid Cooling with Chiller-less Data Center Design to Enable Significant Energy Savings", 28th Annual IEEE Semiconductor Thermal Measurement and Management Symposium (Semi-Therm), 2012, pp. 212-223, ©2012 IEEE. DOI: 10.1109/STHERM.2012.6188851.

\* cited by examiner

COOLING METHODS FOR ELECTRONIC COMPONENTS

TECHNICAL FIELD

Embodiments described herein generally relate to cooling systems, and more specifically, to cooling systems for electronic components.

BACKGROUND

The heat generated by electronic devices is proportional to the frequency at which they are operated. High operating frequencies result in high heat generation. In addition, the heat generated by electronic devices may be concentrated in locations where electrical components are placed in close proximity to one another. As one example, densely packed electrical components may concentrate the heat that the electronic devices generate. Modern electronic devices may include numerous closely-spaced components operated at high frequencies. Accordingly, modern electronic devices may generate a substantial amount of localized heat during operation.

SUMMARY

In one embodiment, a method is provided for conveying heat away from an electronic component. The method may include positioning a conformable thermal interface sleeve embracing the electronic component in an installed position. The method may further include positioning a heat conducting wedge in contact with the conformable thermal interface sleeve and positioning a thermal channel in contact with the heat conducting wedge. The method may also include positioning a manifold in contact with the thermal channel.

In another embodiment, an apparatus is provided for an apparatus for conveying heat away from an electronic component. The apparatus may include a conformable thermal interface sleeve adapted to embrace the electronic component. The apparatus may further include a heat conducting wedge adapted to contact the conformable thermal interface sleeve and a thermal channel adapted to contact the heat conducting wedge. The apparatus may also include a manifold adapted to contact the thermal channel.

BRIEF DESCRIPTION OF THE DRAWINGS

In the Figures and the Detailed Description, like numbers refer to like elements.

DETAILED DESCRIPTION

Figure 1:
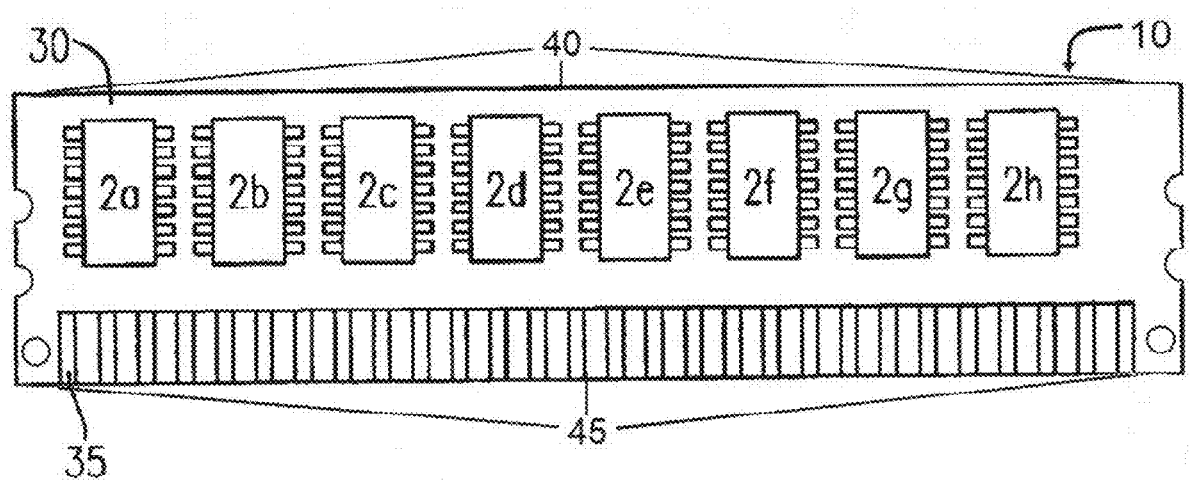
FIG. 1 shows a schematic representation of an electronic component according to one embodiment of the invention.

Often heat must be removed from an electronic component and its immediate area in order for the component to maintain an operational temperature within desired limits. Failure to remove heat effectively results in increased component temperatures, which in turn, may lead to thermal runaway conditions causing decreased performance and potentially catastrophic failure. Thermal management is the process of maintaining a desirable temperature in electronic devices and their surroundings. Several trends in the electronic industry have converged to increase the importance of thermal management. The desire for faster and more densely packed circuits has had a direct impact on the importance of thermal management. First, heat production increases as device operating frequencies increase. Second, as more and more devices are packed into a single chip, heat flux (Watts/cm$^2$) increases, resulting in the need to more aggressively remove heat from a given size chip or module. These higher operating frequency and device density trends have combined to create applications where it is no longer desirable to remove heat from modern devices solely by traditional air cooling methods, such as by using air cooled heat sinks with vapor chambers. Such air cooling techniques are inherently limited in their ability to extract heat from an electronic component with high power density. The need to cool current and future high heat load, high heat flux electronic components and systems therefore mandates the development of aggressive thermal management techniques using alternate cooling methods. The prior methods may limit access and serviceability of the cooled electronic components as they may either limit heat transfer due to limited contact with the electronics, mechanically connect to the cooled electronic component, or envelope it in such a way that access may be impeded without disassembly of the cooling system. Traditional electronic cooling means may require time consuming operations for disassembly and reassembly of the cooling apparatus to allow access and serviceability of the electronic component, embodiments disclosed below may have greatly reduced difficulty and time in accessing and servicing the electronic components.

Features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments may be practiced and to further enable those of skill in the art to practice the invention. It is also to be understood that the descriptions of the embodiments are provided by way of example only, and are not intended to limit the scope of this invention as claimed.

FIG. 1 is one embodiment of an electronic component 10 having a multiplicity of electronic devices 2a through 2h (collectively hereafter referred to as 2) which are mounted on a circuit board 30. The circuit board 30 has a connector 35. In various embodiments, the circuit board 30 may be a printed circuit board (PCB), printed wiring board (PWB), etched wiring board, or other body for mounting and electrically connecting electronic devices. In various embodiments, the electronic device mounted to the circuit board 30 may include any of the following: microprocessors, capacitors, resistors, inductors, semi-conductor elements, integrated circuits, chip carriers, or any electric devices designed or modified for mounting on a circuit board 30.

Connector 35 may be used to interface the electronic component 10 with other electronics, allowing for the transfer of information, and may optionally provide a conduit for electric power to the electronic component 10. In one embodiment, the connector 35 may be a computer bus interface connector, one example of which is a Peripheral Component Interconnect Express (PCIe) style edge connector. In another embodiment, the connector 35 may be a computer memory edge connector, communication socket, or a board-to-board connector. In another embodiment, the connector 35 may be of an optical type. One embodiment of the electronic component 10 may be a memory module. In other embodiments, this electronic component 10 may be a graphics card, network card, expansion card, adaptor card, interface card, server component, server blades, or other electronic component. It is contemplated that additional forms of connector 35 or electronic component 10 may be employed and still remain within the scope and spirit of the presented invention.

In the illustrated embodiment, a proximal end 45 of the electronic component 10 is the end with the connector 35. A distal end 40 of the electronic component 10 is the side opposite proximal end 45. In various embodiments, the distal end 40 of the electronic component 10 is the end of the component that may have force applied to it for installing the electronic component 10 into an installed position.

Figure 2A:
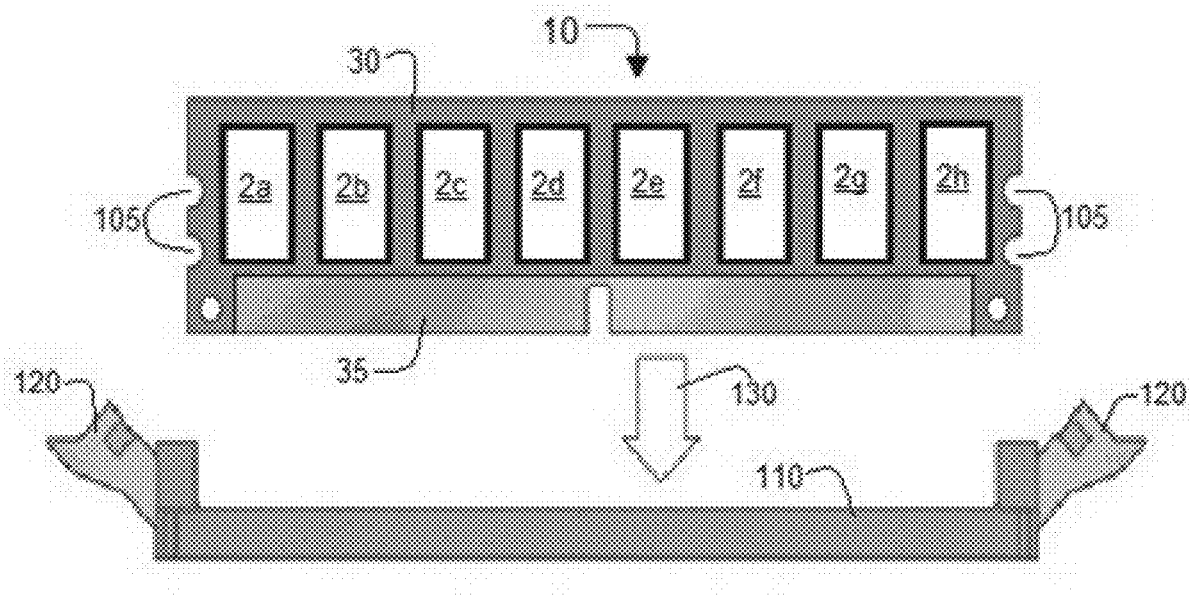
FIG. 2A shows a schematic representation of an electronic component positioned to be installed into a receptacle, according to one embodiment of the invention.
Figure 2B:
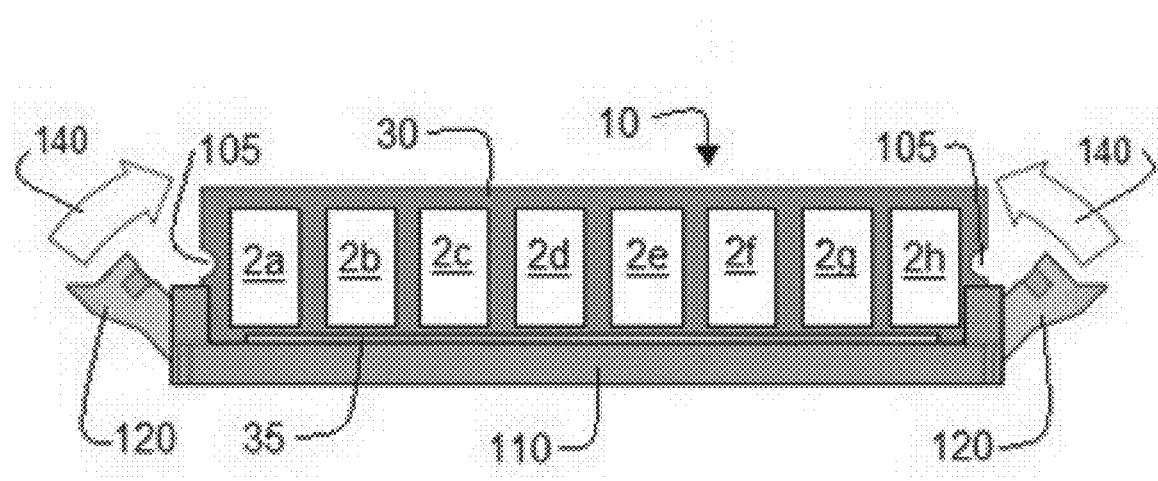
FIG. 2B shows a schematic representation of an electronic component installed in the receptacle of FIG. 2A, according to one embodiment of the invention.

In FIG. 2A, the electronic component 10 is oriented for installation in an exemplary receptacle 110 with an arrow 130 indicating the direction of insertion. FIG. 2B shows the same embodiment with the electronic component 10 having been inserted in receptacle 110 and the latches 120 being moved into a latched position. Here, the latches 120 snap into notches 105 formed within the electronic component 10 to latch it into place with receptacle 110. Other embodiments of the receptacle 110 may employ alternative mechanisms to secure the electronic component 10 once installed or no latching mechanism 120 may be used.

Figure 3A:
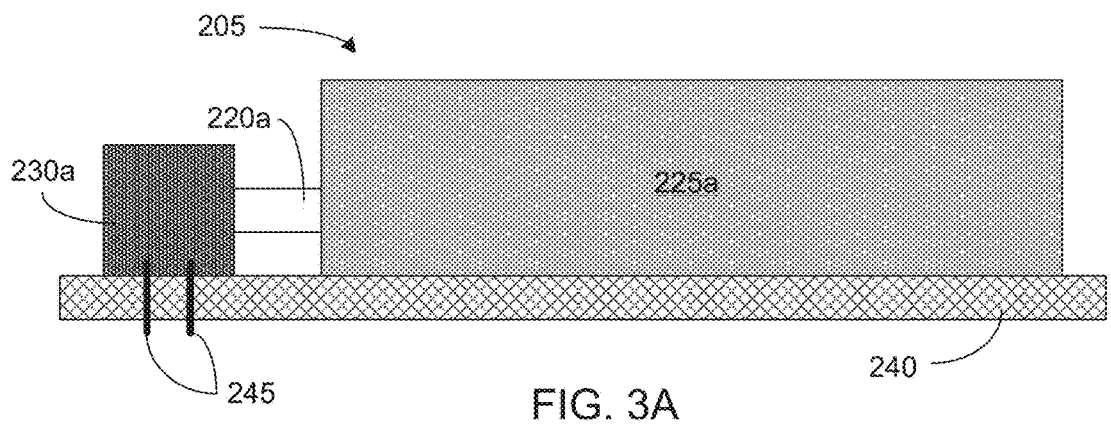
FIG. 3A is a side view of a cooling apparatus assembled, according to one embodiment of the invention.
Figure 3B:
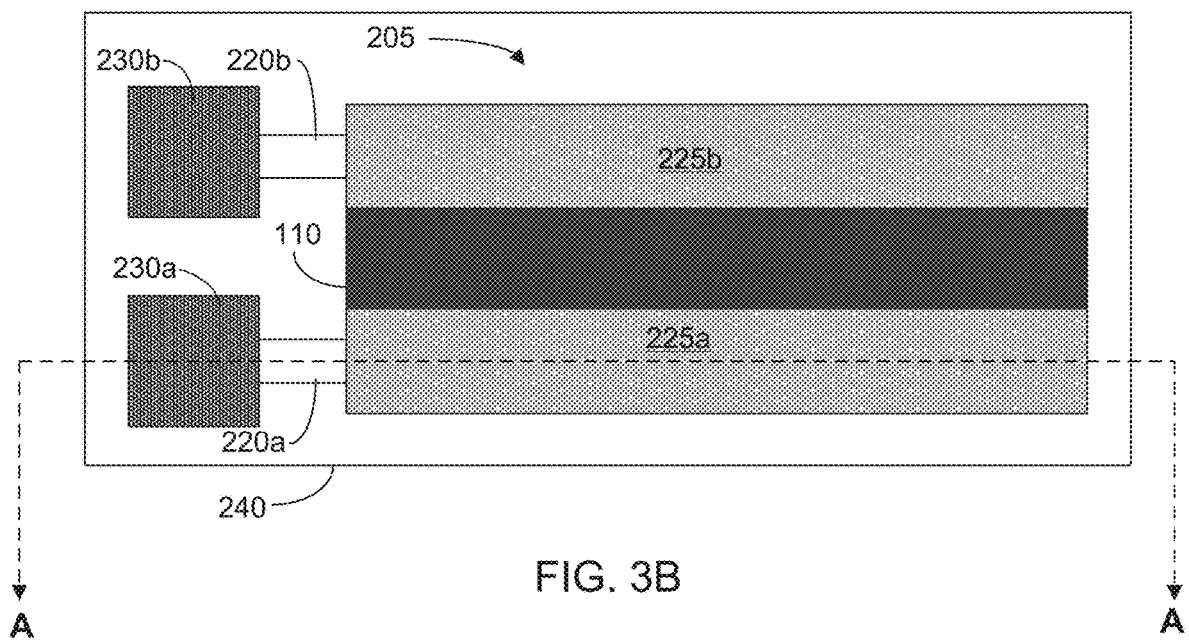
FIG. 3B is a top view of the cooling apparatus of FIG. 3A assembled, according to one embodiment of the invention.
Figure 3C:
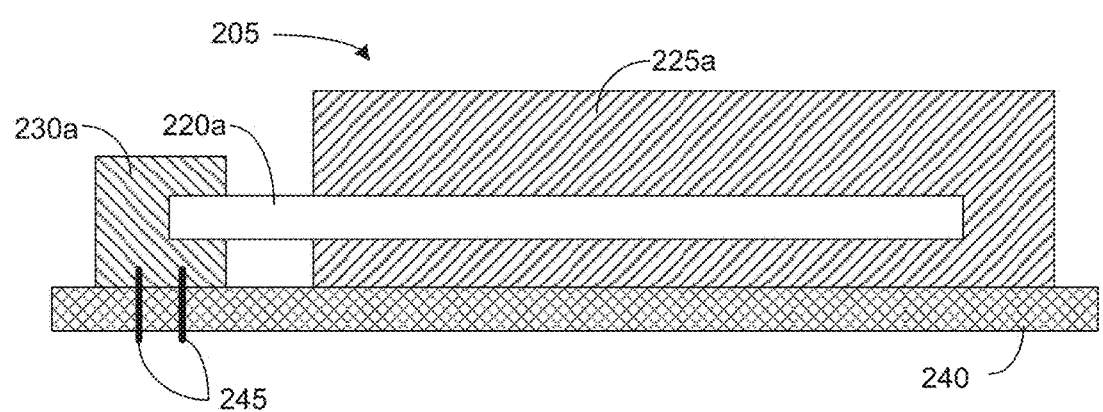
FIG. 3C is a horizontal cross sectional view along plane A-A' of the cooling apparatus of FIG. 3B, according to one embodiment of the invention.

FIG. 3A is a side view schematic of one embodiment of a cooling apparatus 205 and is paired with FIG. 3B, a top view schematic of the same embodiment, and FIG. 3C, a horizontal cross sectional view along plane A-A', in accordance with the present invention. The cooling apparatus 205 may include: a heat conducting wedge 225a, a thermal channel 220a, and a manifold 230a. The heat conducting wedge 225a may be adapted to embrace a conformable thermal interface sleeve 310 in an installed position (see FIGS. 4A, 4B). The conformable thermal interface sleeve 310 may be adapted to embrace the electronic component 10 of FIG. 1 while the electronic component 10 is in the installed position in the receptacle 110. A second heat conducting wedge 225b may be adapted to embrace the conformable thermal interface sleeve on a different side when in the installed position as shown in FIG. 3B. The thermal channel 220a is shown adapted to contact the heat conducting wedge 225a. An equivalent thermal channel 220b is shown adapted to contact the heat conducting wedge 225b. In the embodiment shown, the thermal channels, 220a and 220b, are disposed within the respective heat conducting wedges 225a and 225b. The thermal channels, 220a and 220b, may also be in contact with respective manifolds 230a and 230b. This may allow for heat generated in the electronic component 10, when installed in the receptacle 110 and embraced by the conformable thermal interface sleeve, to be transferred away from the electronic component 10 to the manifolds 230a and 230b for dispersion.

In the illustrated example, the manifold 230a is shown mounted to a planar panel 240 using one or more pins 245. In various embodiments, the planar panel 240 may be a motherboard, the inside of a computer case, or part of a server housing. In other embodiments, the manifold 230a may be mounted outside of and independent of any housing or containment of the electronic component 10 it is designed to cool. The illustrated example shows use of the set of pins 245 on a single side of the manifold 230a for mounting. In other embodiments, the manifold 230a may be mounted using screws, bolts, adhesives, or any mechanical means reasonable for securing it to a location and it may be mounted on one or more sides. These forms of mounting and installing are to be exemplary only and are not meant to limit the possible methods of mounting or installation of the manifold 230a.

In the illustrated embodiment, the thermal channels 220a and 220b each use a single manifold 230a and 230b respectively. In other embodiments, two or more thermal channels, such as 220a and 220b, may use a single manifold 230 jointly. The thermal channel 220a is shown as a single solid member with one end press fit into the manifold 230a and the opposing end press fit into the heat conducting wedge 225a. In other embodiments, the thermal channel 220a may be coupled to the manifold 230a or heat conducting wedge 225a by methods such as screwing, clamping, solder, welding, gluing, or any other suitable means. In other embodiments of the invention, actual coupling of the thermal channel 220a to either the heat conducting wedge 225a or the manifold 230a is not required. Contact allowing heat transfer between the elements may be sufficient.

The manifolds 230a and 230b may accept the heat transferred through the thermal channels 220a and 220b and may dissipate this heat safely away from an electronic component 10 that generates the heat. The illustrated embodiment of the manifold 230 is shown as a solid block. In other embodiments, the manifold 230 may have multiple components and elements. In some embodiments, the manifold 230 may use finning to improve heat dissipation. In another embodiment, the manifold 230 may use a fluid disposed within it to dissipate the heat.

The contact between elements may allow for the heat created by the electronic component 10 to be transferred away from the electronic component 10 and the surrounding area and may prevent failures or errors from occurring within the electronic component 10. The combination of elements may allow an embodiment of the invention to transfer the heat from the electronic component to the embracing conformable thermal interface sleeve 310. The conformable thermal interface sleeve 310 may then transfer the heat taken from the electronic component to the contacting heat conducting wedge 225. The heat may then be transferred from the heat conducting wedge 225 to the manifold 230 by the thermal channel 220 in contact with both.

Figure 4A:
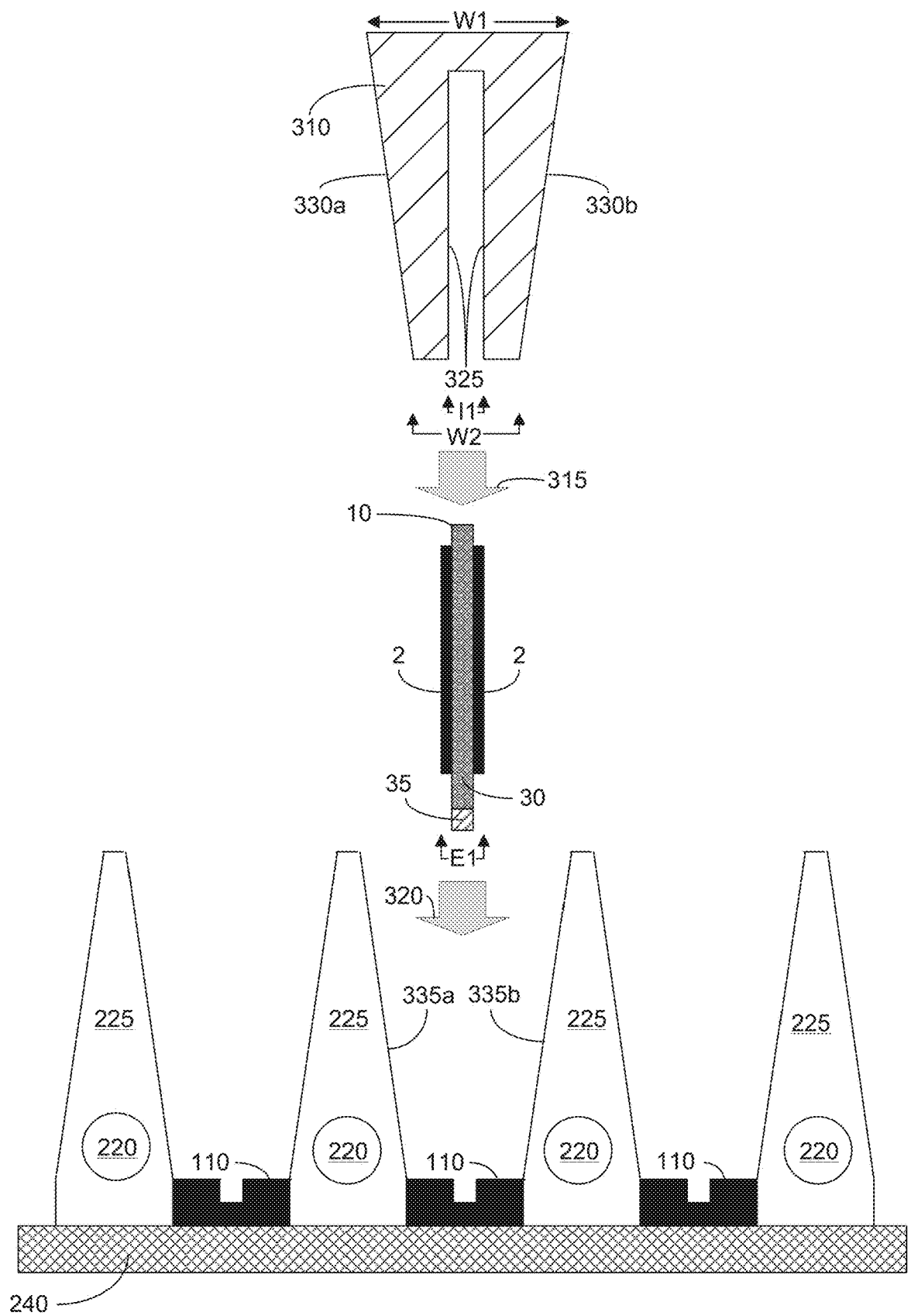
FIG. 4A is a cross sectional view of a cooling apparatus and an electronic component prior to assembly, according to one embodiment.
Figure 4B:
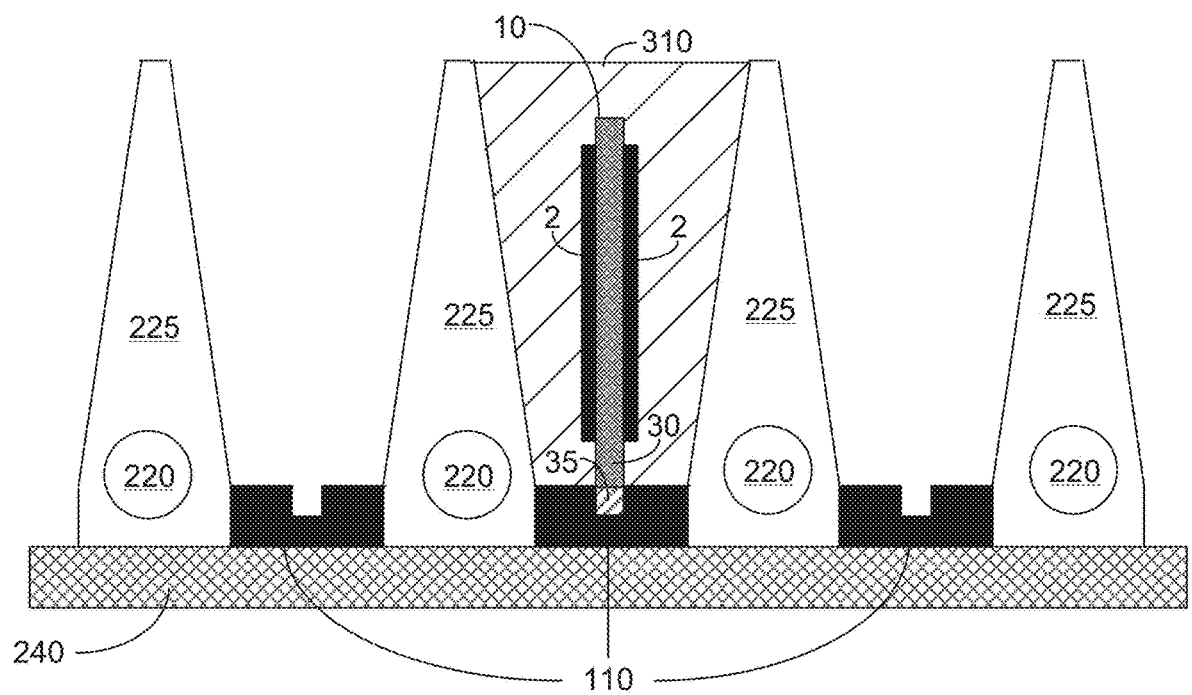
FIG. 4B is a cross sectional view of the cooling apparatus and electronic component of FIG. 4A after assembly, according to one embodiment.

FIG. 4A is a cross sectional view of the conformable thermal interface sleeve 310, heat conducting wedges 225 with thermal channels 220 disposed within each, and the electronic component 10 prior to installation according to one embodiment. In the illustrated embodiment, an arrow 315 indicates the location and direction of installation of the conformable thermal interface sleeve 310 to embrace the electronic component 10. An arrow 320 indicating the location and direction of installation of connectors 35 of the electronic component 10 into receptacles 110. FIG. 4B is a schematic view of the same embodiment after assembly. The heat conducting wedges 225 may be dimensioned or positioned to be offset from the receptacles 110, such that they make contact with the conformable thermal interface sleeve 310 when embracing the installed electronic component 10, but do not interfere with insertion of the electronic component 10 into the receptacle 110. In one embodiment, the thermal channel 220 may be located between two opposing sides of the heat conducting wedge 225 such that it may receive and transfer heat from conformable thermal interface sleeves 310 installed on either side of the heat conducting wedge 225.

The greater the thermally conductive contact area between the two bodies, the greater the amount of heat that may be conducted between them. The conformable thermal interface sleeves 310 may conform to elements on the electronic component 10, specifically devices 2. This ability to conform around devices on the electronic component 10 may provide a larger contact area for heat conduction. The conformability of the conformable thermal interface sleeves 310 also enables it to adapt to different sizes and shapes of electronic components 10 that may be installed in the receptacle 110. This allows for upgrading or replacing of electronic components 10 over time without a concern for modification or adjustment of the cooling apparatus 205. For example, when replacing a failed electronic device 10 the service technician need not first remove or disassemble the cooling apparatus 205 in order to access and replace electronic components 10.

The conformable thermal interface sleeve 310 may use a conformable thermal interface material to embrace the electronic component 10. In one embodiment, the conformable thermal interface sleeve 310 may use, or be formed from, a thermally conductive polymeric composite material. One example material that may be used to form the conformable thermal interface sleeve 310 is a Gap Pad VO®, by the Berquist Company of Chanhassen, Minn. It has a thermal conductivity of 0.8 W/m-K and a Young's modulus, the measure of elasticity, of 100 kPa. These properties give it both acceptable heat transfer capabilities and an ability to conform to the unevenness and changing topography of electronic component 10. It is contemplated that other materials may be used for the conformable thermal interface sleeve 310 and still remain within the scope and spirit of the present invention. The thermal conductivity of any such material may be greater than 0.65 W/m-K, and have a Young's modulus of less than 200 kPa. In various embodiments, the conformable thermal interface sleeve 310 may contain additional elements that may add rigidity or form to it. An example of this may be a metal shell encompassing the outside of the conformable thermal interface sleeve 310. Such a shell may assist the conformable thermal interface sleeve 310 in maintaining a specific shape. The shell may also improve the ability of the conformable thermal interface sleeve 310 to embrace, or clamp, to the electronic component 10.

In one embodiment, the conformable thermal interface sleeve 310 may have top width of W1 and a bottom width of W2. In embodiments where the top width W1 and bottom width W2 differ the conformable thermal interface sleeve 310 may have angled surfaces 330a and 330b. In one embodiment, W1 is greater than W2. The angles of surfaces 330a and 330b may be defined with respect to the plane of panel 240 and may be other than a right angle, e.g., 15 degrees. These angled surfaces, 330a and 330b, may be congruent with angled wedge surfaces 335a and 335b on the heat conducting wedges 225. The use of angled surfaces on the elements may allow for easier assembly. The use of angled surfaces may also increase the contact area between the conformable thermal interface sleeve 310 and the heat conducting wedges 225. In various embodiments, the angled surfaces 330a and 330b may differ as may the angled wedge surfaces 335a and 335b. In various embodiments, no difference in top width of W1 and a bottom width of W2 may occur.

In various embodiments, while the conformable thermal interface sleeve 310 is designed to fit over or cover another part, it need not be in the precise shape of a common sleeve, i.e., circular or tubular. The conformable thermal interface sleeve 310 may be a piece of conformable thermal interface material having an interior portion that fits over, covers, or embraces multiple sides of the electronic component 10. For example, the conformable thermal interface sleeve 310 may wrap over the electronic component 10 effectively embracing, or clamping it from multiple sides. In one embodiment, the electronic component 10 may have an electronic component width E1. The inside surface of the conformable thermal interface sleeve 310 where it may embrace the electronic component 10 may be referred to as contact surface 325. The contact surface 325 may have an inside width I1. The inside width I1 may be less than the electronic component width E1. For example, the inside width I1 may be 8 mm and the electronic component width E1 may be 10 mm. This may result in the material of the conformable thermal interface sleeve 310 displacing around the electronic component 10. The displacement may result in improved contact area between the two along with tension in the conformable thermal interface sleeve 310 for gripping the electronic component 10.

In various embodiments, the contact surface 325 of the conformable thermal interface sleeve 310 may be sculpted so that it has a profile that conforms to a configuration of an electronic component 10 it may embrace. Various electronic components 10 may be configured with a variety of electronic devices 2 at a variety of different locations. In addition, the electronic devices 2 may have a variety of shapes and sizes. In one embodiment, the contact surface 325 may be sculpted to match a family of electronic components that may have a standard size and shape, for example a generic memory module. In another embodiment, the contact surface 325 may be sculpted to match a specific brand or type of memory module. One skilled in the art will appreciate the variety of factors that can affect the sculpting of the contact surface 325. Sculpting of the contact surface may allow for improved heat transfer from the electronic component 10 that may improve productivity, efficiency, or life of the electronic component 10.

An advantage of the use of the conformable thermal interface sleeve 310 and the heat conducting wedge 225 is that an electronic component 10 may be installed or removed without disassembly of a cooling apparatus 205 according to the principles of the present invention. For example, a technician servicing an electronic device need not first remove a cooling apparatus 205 that is used to remove heat from electronic component 10 in order to access electronic component 10. The conformable thermal interface sleeve 310 need only be removed to access the electronic component 10 for service. As further described below, a cooling apparatus 205 according to present invention may include fluid within the heat conducting wedge 225, a thermal channel 220, or the manifold 230. Further, the fluid may flow between the various elements that may require secure coupling to prevent leaks. Traditional electronic cooling using fluids may require time consuming operations for disassembly and reassembly of the cooling apparatus to allow access and serviceability of the electronic component 10. Further, such traditional designs may risk damaging any electronics in the vicinity of the installation location of the electronic component 10 by having fluids being spilled on them. The use of a conformable thermal interface sleeve 310 may eliminate the need for disassembly of the cooling apparatus 205 when installing or removing an electronic component, which may advantageously prevent an undesired introduction of fluid into an electronic component environment. Moreover, known apparatus for cooling electronic components are typically complex devices. Known apparatus may wrap around or may be physically engaged with an electronic component by retaining clips or other fasteners. A further advantage of a cooling apparatus according to the present invention may be improved serviceability of a computer system in comparison with systems using a known complex cooling apparatus.

Figure 5A:
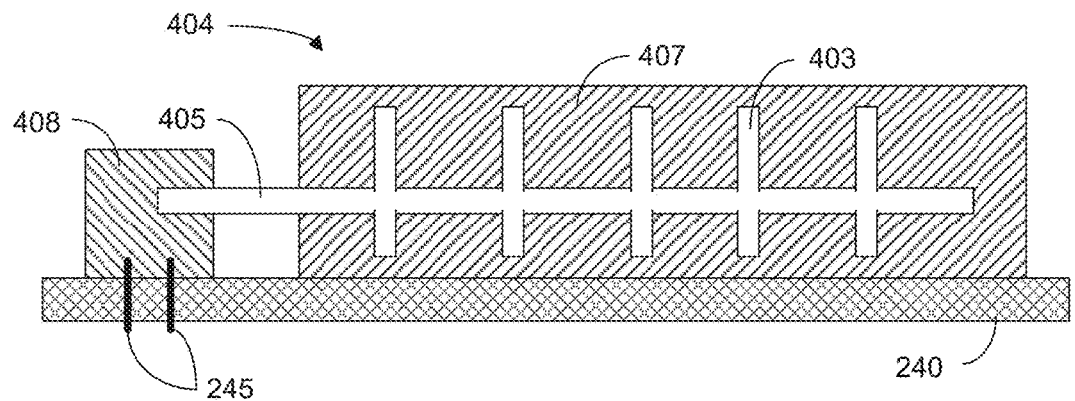
FIG. 5A is a horizontal cross sectional view of a cooling apparatus, according to one embodiment of the invention
Figure 5B:
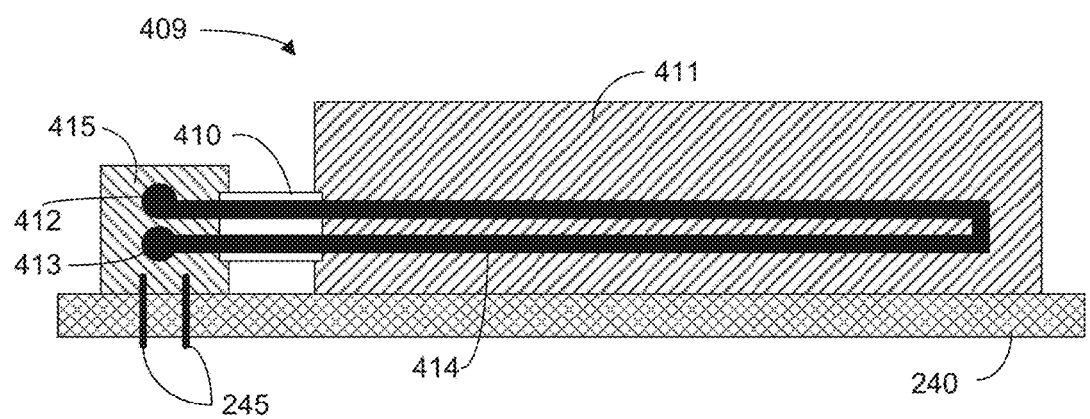
FIG. 5B is a horizontal cross sectional view of a cooling apparatus, according to one embodiment of the invention
Figure 5C:
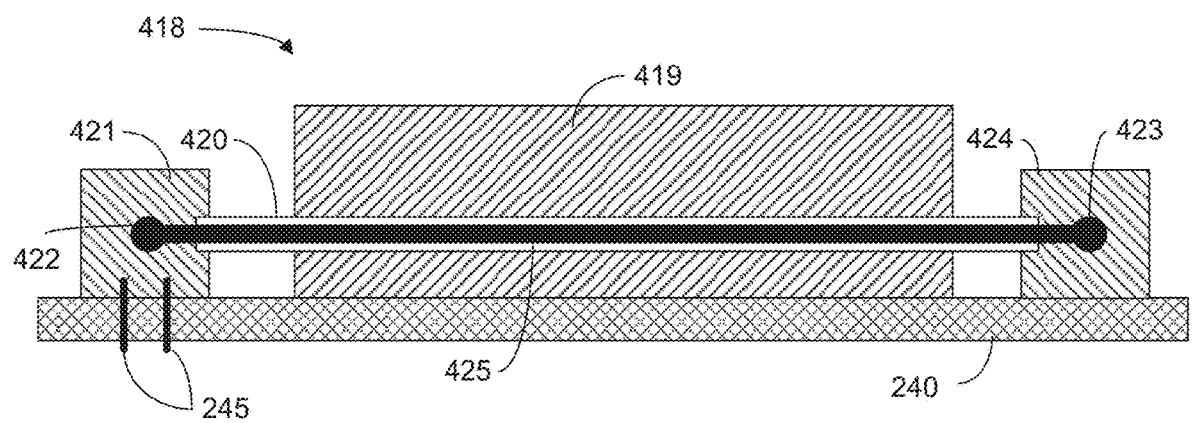
FIG. 5C is a horizontal cross sectional view of a cooling apparatus, according to one embodiment of the invention

FIGS. 5A, 5B, and 5C are horizontal cross sectional views of various embodiments of the invention. These embodiments provide examples of the variation that may occur in the combination of the heat conducting wedge, thermal channel, and manifold. One skilled in the art will realize that these variations in design are not limited to the shown examples and that various embodiments may also alter or combine elements shown in the examples.

FIG. 5A is an example of a variation of the thermal channel 405 and the heat conducting wedge 404 for cooling apparatus 404. In the shown embodiment, the thermal channel 405 includes branches 403 that extend into the heat conducting wedge 407. In various embodiments, the thermal channel 405 may be coupled to the heat conducting wedge 404 or manifold 408. In other embodiments, two or more of these elements may be combined in manufacturing. For example, the thermal channel 405 and heat conducting wedge 407 may be a single molded piece.

In various embodiments, the cooling apparatus may use simple conduction to transfer heat away from the electronic component 10 to the manifold 408. In other embodiments, the cooling apparatus 409 may also make use of convective heat transfer methods by using fluids flowing within various elements of the cooling apparatus 409. FIG. 5B is an example of a variation that may occur if fluid is used in the thermal transfer of the cooling apparatus 409. In this example, manifold 415 may have inlet 412 and outlet 413 for fluid to be circulated through the cooling apparatus 409. The manifold 415, thermal channel 410, and the heat conducting wedge 411 may all have aligning hollowed out sections that create a fluid channel 414. The fluid channel 414 may allow a fluid to be circulated throughout the cooling apparatus 409. In various embodiments, the fluid may be circulated through any combination of the elements. The fluid may be wholly contained within the cooling apparatus 409 or it may be provided externally by a system that provides, and may circulate, fluid to one or more cooling apparatus 409. In one embodiment, the fluid may be circulated by a pumping system located within the manifold 415. In some embodiments, the fluid channel 414 may be a heat pipe which uses a wick element and capillary pressure action to transfer heat between sections of the fluid channel 414 and other elements of the cooling apparatus 409. Other embodiments may use refrigeration effects such as boiling and condensation of fluids in various sections to transfer the heat.

FIG. 5C is an example of a variation that has more than one manifold. In one embodiment, a thermal channel 420 is in contact with two manifolds, 421 and 424. In this example, manifold 421 has fluid inlet 422. The fluid may flow through the fluid channel 425 starting in manifold 421 and continuing into thermal channel 420, finally ending in manifold 424. Manifold 424 may have fluid outlet 423. The fluid and heat transfer involved may be similar to examples mentioned previously. In various embodiments, more than one manifold, such as 421 and 424, or thermal channel 420 may be used to transfer heat away from the heat conducting wedge 419 so that the electronic component 10 may be kept at an appropriate temperature.

Figure 6:
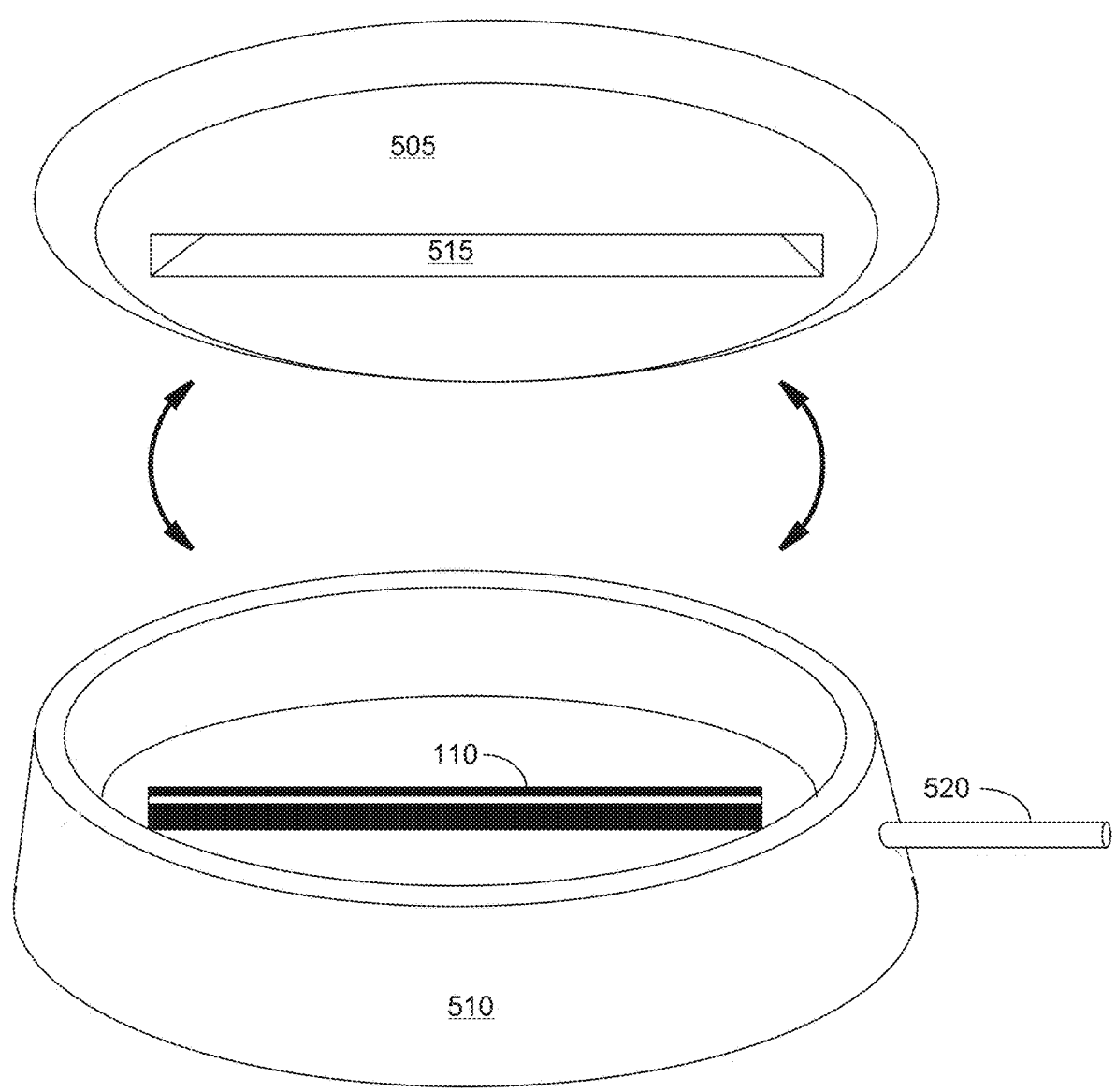
FIG. 6 shows a schematic representation of a conformable thermal interface sleeve positioned to be installed into a heat conducting sleeve, according to one embodiment of the invention.

FIG. 6 is a schematic representation of one embodiment of the invention with a conformable thermal interface sleeve 505 positioned to be installed into a heat conducting sleeve 510. In this embodiment, the conformable thermal interface sleeve 505 has a slot 515 sculpted to embrace the electronic component 10. The slot may be aligned with the receptacle 110, such that the embrace of the conformable thermal interface sleeve to the electronic component does not interfere with the connection between the electronic component 10 and the receptacle 110. The conformable thermal interface sleeve 505 may be shaped to be embraced by a heat conducting sleeve 510. The heat conducting sleeve may have thermal channel 520 adapted in contact with it and to provide a path for heat transfer away from the electronic component 10. The heat conducting sleeve 510 may be aligned so that when the conformable thermal interface sleeve 505 is fully embraced the slot 515 may align properly with the receptacle 110 for the electronic component 10. In various embodiments, the heat conducting sleeve 510 need not be circular or tubular. The conformable thermal interface sleeve 510 may be a one or more pieces of heat conducting material that embrace multiple sides of the conformable thermal interface sleeve 505.

Figure 7:
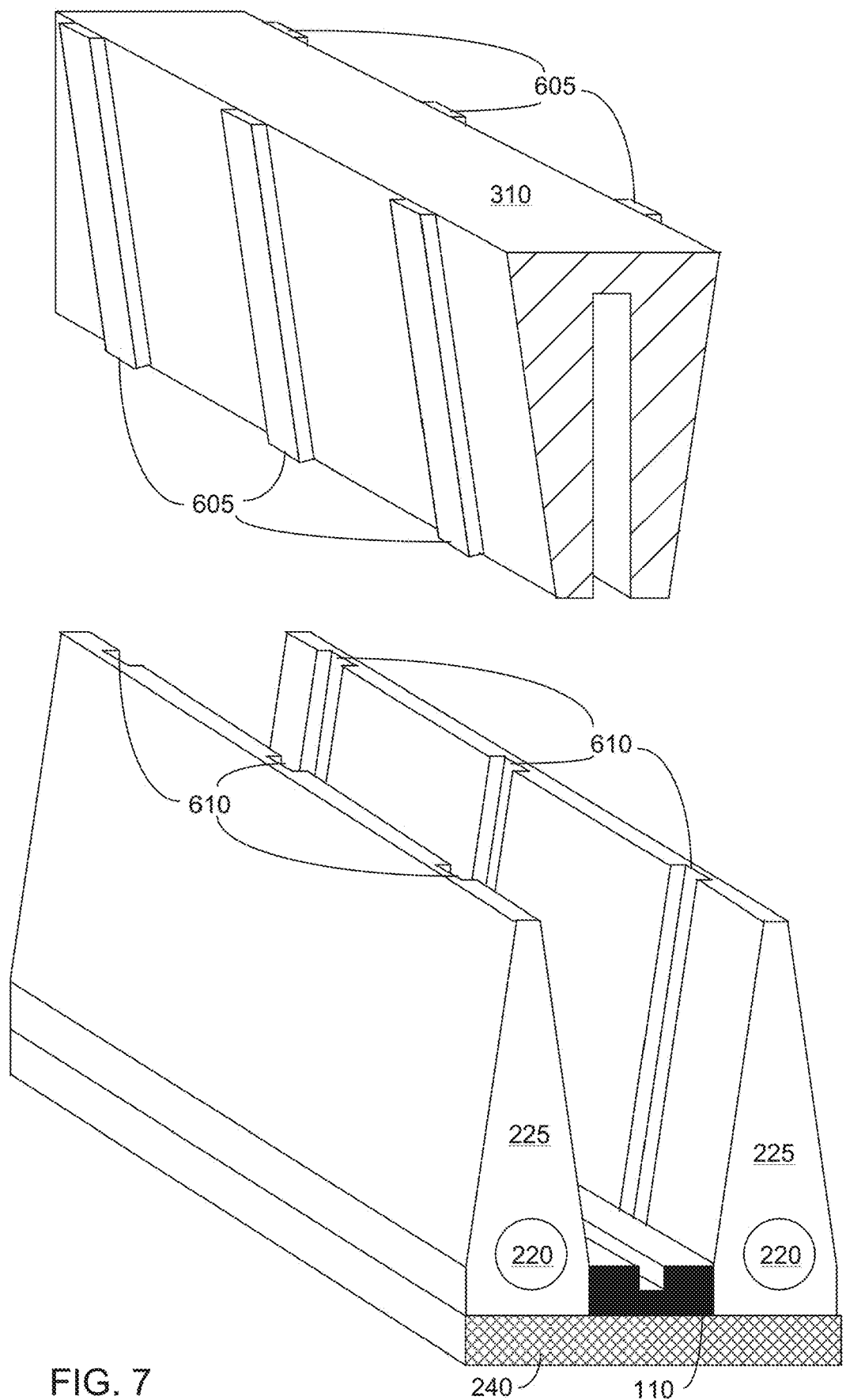
FIG. 7 is a schematic representation of a cooling apparatus that includes a thermal interface wedge or sleeve having guides for alignment, according to one embodiment of the invention.

FIG. 7 is a schematic representation of the embodiment of FIGS. 4A and 4B modified to include guides for alignment. The conformable thermal interface sleeve 310 has ridges 605 added. In one embodiment, the ridges 605 may be sculpted sections of the conformable thermal interface material. In another embodiment, the ridges may be another type of material that is coupled with the conformable thermal interface sleeve 310. The ridges 605 on the conformable thermal interface sleeve 310 may be matched to grooves 610 on the heat conducting wedges 225. The combination of the grooves 610 and ridges 605 may create a guide for proper contact between the conformable thermal interface sleeve 310 and the heat conducting wedges 225. In various embodiments, the grooves 610 may be located on the conformable thermal interface sleeve 310 or the ridges may be located on the heat conducting wedges 225. In various embodiments, one or more ridge 605 and groove 610 combinations may be used. In other embodiments, the groove 610 and ridge 605 combinations may be used with a conformable thermal interface sleeve 505 and a heat conducting sleeve 510.

Figure 8:
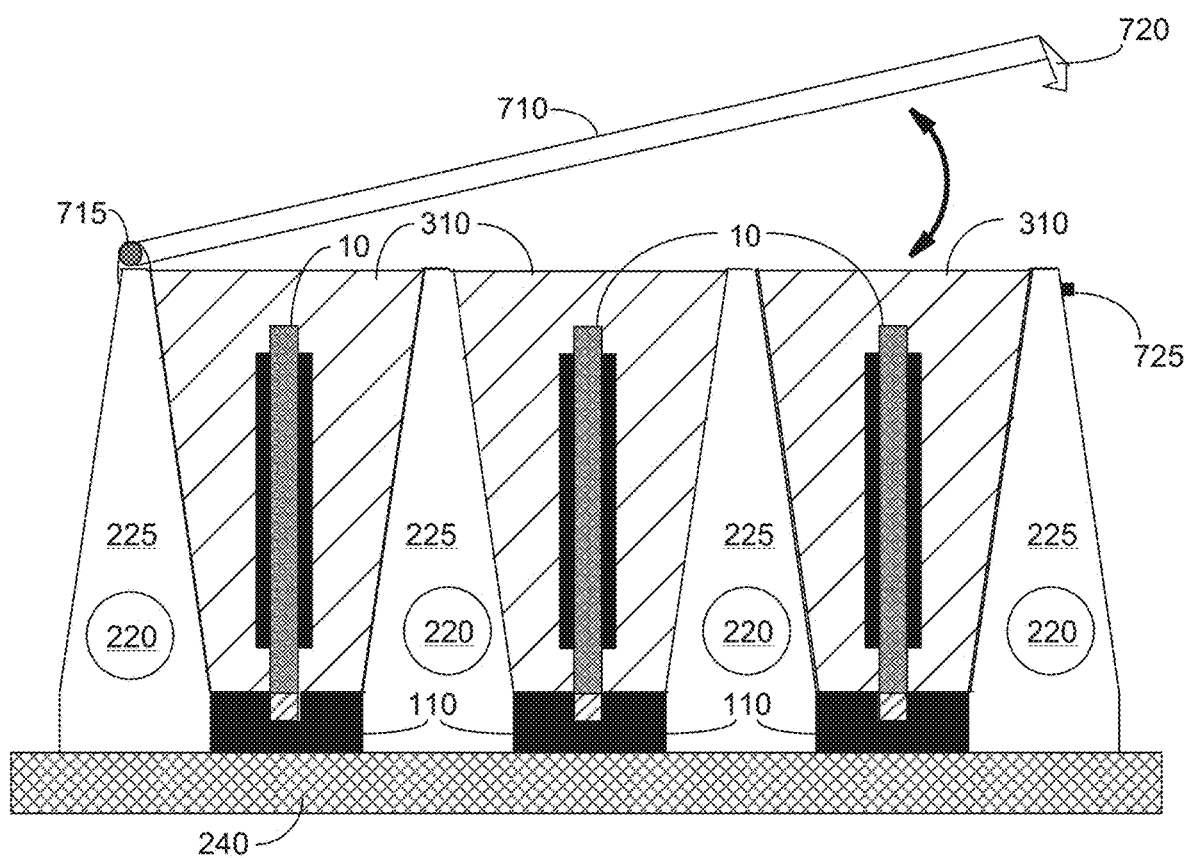
FIG. 8 is a cross sectional view of the embodiment shown in FIG. 4B with the addition of a latching element, according to one embodiment of the invention.

FIG. 8 is a cross sectional view of the embodiment shown in FIG. 4B with the addition of a latching element. The conformable thermal interface material used in the conformable thermal interface sleeve 310 may have an elasticity to it that results in an internal counter force that resists the conformity to electronic component 10 or the contact with the heat conducting wedges 225. In various embodiments, this may be overcome by the force of gravity once installation of all elements has occurred. In other embodiments, a latching mechanism may be used to counter these forces. In the example, a latching plate 710 may be positioned to latch over the installed conformable thermal interface sleeve 310. The latching plate 710 may rotate using hinge 715 such that upon closing latching hook 720 may engage and latch around element 725. In various embodiments, a latching mechanism may be used with a conformable thermal interface sleeve 505 and a heat conducting sleeve 510. In various embodiments, the latching mechanism may be connected to the planar panel 240 or to other elements surrounding the cooling apparatus 205. In various embodiments, the latching mechanism may not use a hinge 715. One skilled in the art will appreciate the variety of forms the latching mechanism may take. The use of such a latching mechanism may improve the contact between the conformable thermal interface sleeve 310 and the heat conducting wedge 225 so that increased thermal transfer may occur.

While the disclosed subject matter has been described with reference to illustrative embodiments, this description is not intended to be construed in a limiting sense. Various modifications of the illustrative embodiments, as well as other embodiments of the subject matter, which are apparent to persons skilled in the art to which the disclosed subject matter pertains are deemed to lie within the scope and spirit of the disclosed subject matter.

What is claimed is:

1. A method for conveying heat away from a circuit board having at least one integrated circuit mounted thereon, the method comprising:
   installing a connector of the circuit board into a receptacle; and
   fitting a conformable thermal interface sleeve over the circuit board by inserting the circuit board through an opening to an interior portion of the conformable thermal interface sleeve such that the interior portion embraces both a first side surface of the circuit board and a second side surface of the circuit board,
   wherein, after the conformable thermal interface sleeve is fitted over the circuit board and the circuit board is installed, heat generated by the at least one integrated circuit of the circuit board during use is conducted away from the circuit board through the conformable thermal interface sleeve.

2. The method of claim 1, wherein the circuit board has at least one memory module.

3. The method of claim 1, wherein the conformable thermal interface sleeve is elastically conformable such that it elastically conforms about the at least one integrated circuit mounted on the circuit board as the sleeve is being fitted over the circuit board.

4. The method of claim 3, wherein the conformable thermal interface sleeve is a one-piece structure.

5. The method of claim 1, wherein the integrated circuit extends outwardly from a portion of the first side surface of the circuit board, and wherein the interior portion of the conformable thermal interface sleeve elastically conforms around the integrated circuit and embraces substantially the entire first side surface once the circuit board is inserted through the opening to the interior portion of the conformable thermal interface sleeve.

6. The method of claim 1, wherein the conformable thermal interface sleeve is made from a polymeric composite material.

7. The method of claim 1, wherein the conformable thermal interface sleeve is made from a material having a Young's modulus of less than 200 kPa.

8. The method of claim 1, wherein the interior portion of the thermal interface sleeve has a width that is less than a width of the circuit board, and wherein the interior portion having a width that is less than the width of the circuit board causes the thermal interface sleeve to be displaced as the circuit board is inserted through the opening.

9. A method for removing heat generated by a circuit board having at least one integrated circuit mounted thereon, wherein a conformable thermal interface sleeve is fitted over the circuit board such that an interior portion of the conformable thermal interface sleeve embraces both a first side surface of the circuit board and a second side surface of the circuit board, the method comprising:
   conducting the heat generated by the at least one integrated circuit of the circuit board, over which the conformable thermal interface sleeve is fitted, away from the circuit board through the conformable thermal interface sleeve.

10. The method of claim 9, wherein the circuit board has at least one memory module.

11. The method of claim 9, wherein the conformable thermal interface sleeve is elastically conformable such that it is elastically conformed about the at least one integrated circuit mounted on the circuit board while fitted over the circuit board.

12. The method of claim 11, wherein the conformable thermal interface sleeve is a one-piece structure.

13. The method of claim 9, wherein the integrated circuit extends outwardly from a portion of the first side surface of the circuit board, and wherein the interior portion of the conformable thermal interface sleeve elastically conforms around the integrated circuit and embraces substantially the entire first side surface.

14. The method of claim 9, wherein the conformable thermal interface sleeve is made from a polymeric composite material.

15. The method of claim 9, wherein the conformable thermal interface sleeve is made from a material having thermal conductivity of greater than 0.65 W/m-K and a Young's modulus of less than 200 kPa.

16. A method for conveying heat away from an electronic component, the method comprising:
   installing a connector of the electronic component into a receptacle; and
   fitting a conformable thermal interface sleeve over the electronic component by inserting the electronic component through an opening to an interior portion of the conformable thermal interface sleeve such that the interior portion embraces both a first side surface of the electronic component and a second side surface of the electronic component,
   wherein, after the conformable thermal interface sleeve is fitted over the electronic component and the electronic component is installed, heat generated by the electronic component during use is conducted away from the electronic component through the conformable thermal interface sleeve, wherein a memory module extends outwardly from a portion of the first side surface of the electronic component, and wherein a first contact surface of the interior portion of the conformable thermal interface sleeve elastically conforms around the memory module and embraces substantially the entire first side surface once the electronic component is inserted through the opening to the interior portion of the conformable thermal interface sleeve.

\* \* \* \* \*